United States Patent
Song et al.

(10) Patent No.: US 10,923,347 B2
(45) Date of Patent: Feb. 16, 2021

(54) METAL OXIDE FILM AND MANUFACTURING METHOD THEREOF, THIN FILM TRANSISTOR AND ARRAY SUBSTRATE

(71) Applicants: Hefei Xinsheng Optoelectronics Technology Co., Ltd., Anhui (CN); BOE Technology Group Co., Ltd., Beijing (CN)

(72) Inventors: Wei Song, Beijing (CN); Ce Zhao, Beijing (CN); Heekyu Kim, Beijing (CN); Ning Liu, Beijing (CN); Yuankui Ding, Beijing (CN); Wei Li, Beijing (CN); Yingbin Hu, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 18 days.

(21) Appl. No.: 16/442,830

(22) Filed: Jun. 17, 2019

(65) Prior Publication Data

US 2020/0152458 A1 May 14, 2020

(30) Foreign Application Priority Data

Nov. 14, 2018 (CN) .......................... 2018 1 1354978

(51) Int. Cl.
*H01L 21/02* (2006.01)
*H01L 27/12* (2006.01)

(52) U.S. Cl.
CPC .. *H01L 21/02554* (2013.01); *H01L 21/02631* (2013.01); *H01L 27/1225* (2013.01)

(58) Field of Classification Search
CPC ........ H01L 21/02554; H01L 21/02631; H01C 17/2412; H01C 17/262
USPC ......................... 257/43; 438/85, 86, 104, 754
See application file for complete search history.

(56) References Cited

U.S. PATENT DOCUMENTS

| 10,204,922 B2 | 2/2019 | Yuan et al. | |
| 2014/0061616 A1* | 3/2014 | Sunagawa | C07D 495/04 257/40 |
| 2014/0183529 A1* | 7/2014 | Yamazaki | H01L 29/45 257/43 |

(Continued)

FOREIGN PATENT DOCUMENTS

| CN | 104979406 A | 10/2015 |
| CN | 105161423 A | 12/2015 |

(Continued)

OTHER PUBLICATIONS

Mar. 11, 2020—(CN) First Office Action Appn 201811354978.2 with English Translation.

*Primary Examiner* — Didarul A Mazumder
(74) *Attorney, Agent, or Firm* — Banner & Witcoff, Ltd.

(57) ABSTRACT

A metal oxide film and a manufacturing method thereof, a thin film transistor and an array substrate are provided. The manufacturing method of the metal oxide film includes: forming a metal oxide film on a base substrate; and supplying a negative ion to the metal oxide film for a preset time period by performing a anodization method, to convert a portion of metal ions in the metal oxide film into a metal oxide.

19 Claims, 2 Drawing Sheets

(56) References Cited

U.S. PATENT DOCUMENTS

| | | | |
|---|---|---|---|
| 2015/0028279 A1* | 1/2015 | Hopstaken | H01L 45/1266 257/4 |
| 2015/0155387 A1* | 6/2015 | Yamazaki | H01L 29/7869 257/43 |
| 2016/0118253 A1* | 4/2016 | Takata | H01L 29/7869 257/43 |
| 2018/0138210 A1* | 5/2018 | Yuan | H01L 33/005 |
| 2018/0199400 A1* | 7/2018 | Lim | H05B 3/56 |

FOREIGN PATENT DOCUMENTS

| | | |
|---|---|---|
| CN | 105355803 A | 2/2016 |
| CN | 106856173 A | 6/2017 |

* cited by examiner

METAL OXIDE FILM AND MANUFACTURING METHOD THEREOF, THIN FILM TRANSISTOR AND ARRAY SUBSTRATE

CROSS-REFERENCE TO RELATED APPLICATIONS

The present application claims priority of Chinese Patent Application No. 201811354978.2 filed on Nov. 14, 2018, the disclosure of which is incorporated herein by reference in its entirety as part of the present application.

TECHNICAL FIELD

At least one embodiment of the present disclosure relates to a metal oxide film and a manufacturing method thereof, a thin film transistor and an array substrate.

BACKGROUND

At present, a thin film transistor (TFT) is a main driving component of a display device such as an active matrix liquid crystal display, an active matrix organic light emitting diode (AMOLED) display, or the like. Therefore, a quality of the semiconductor active layer directly affects a performance of the thin film transistor.

SUMMARY

At least one embodiment of the present disclosure provides a manufacturing method of a metal oxide film, the manufacturing method comprises: forming the metal oxide film on a base substrate; and supplying a negative ion to the metal oxide film for a preset time period by performing an anodization method, to convert a portion of metal ions in the metal oxide film into a metal oxide.

For example, in a manufacturing method of a metal oxide film according to at least one embodiment of the present disclosure, before performing the anodization method, the metal oxide film includes a plurality of oxygen vacancies, and numbers of oxygen vacancies per unit area of at least two different regions in the metal oxide film are unequal.

For example, in a manufacturing method of a metal oxide film according to at least one embodiment of the present disclosure, the oxygen vacancies in the metal oxide film are uniformly distributed after performing the anodization method.

For example, in a manufacturing method of a metal oxide film according to at least one embodiment of the present disclosure, the performing the anodization method comprises: placing the metal oxide film in a electrolytic cell to serve as an anode, and supplying oxygen negative ions to the metal oxide film by an electrolysis method.

For example, in a manufacturing method of a metal oxide film according to at least one embodiment of the present disclosure, an electrolytic solution used in the electrolysis method is a mixed solution comprising ammonium tartrate, ethylene glycol and water.

For example, in a manufacturing method of a metal oxide film according to at least one embodiment of the present disclosure, a mass percentage of the ammonium tartrate in the mixed solution comprising the ammonium tartrate, the ethylene glycol, and the water, is between 1% and 10%.

For example, in a manufacturing method of a metal oxide film according to at least one embodiment of the present disclosure, a mass percentage of the ethylene glycol in the mixed solution comprising the ammonium tartrate, the ethylene glycol, and the water, is between 50% and 80%.

For example, in a manufacturing method of a metal oxide film according to at least one embodiment of the present disclosure, a pH of the electrolytic solution is 6-7.

For example, in a manufacturing method of a metal oxide film according to at least one embodiment of the present disclosure, the electrolysis method comprises one of a constant current mode, a constant voltage mode, a first constant current and then constant voltage mode, and a first constant voltage and then constant current mode; the constant current mode is to apply a constant current to the anode, the constant voltage mode is to apply a constant voltage on the anode.

For example, in a manufacturing method of a metal oxide film according to at least one embodiment of the present disclosure, in a case where the electrolysis method employs the constant voltage mode, a voltage applied to the anode is between 60-100 V; or in a case where the electrolysis method employs the constant current mode, a current density applied to the anode is between 1.5 mA/cm$^2$-3 mA/cm$^2$; or in a case where the electrolysis method employs the first constant current and then constant voltage mode or the first constant voltage and then constant current mode, a voltage applied to the anode during a constant voltage process is between 60-100 V, and a current density applied to the anode during a constant current process is between 1.5 mA/cm$^2$-3 mA/cm$^2$.

For example, in a manufacturing method of a metal oxide film according to at least one embodiment of the present disclosure, in a case where the electrolysis method employs the constant current mode or the constant voltage mode, the preset time period is 60-120 minutes.

For example, in a manufacturing method of a metal oxide film according to at least one embodiment of the present disclosure, in a case where the electrolysis method adopts the first constant current and then constant pressure mode or the first constant voltage and then constant current mode, at least one of a constant current process and a constant voltage process lasts for 40-80 minutes.

For example, in a manufacturing method of a metal oxide film according to at least one embodiment of the present disclosure, before performing the anodization method, the metal oxide is formed by a solution method.

For example, in a manufacturing method of a metal oxide film according to at least one embodiment of the present disclosure, the solution method comprises: forming a film by a precursor solution containing a metal oxide component using spin coating, inkjet printing or printing coating; and treating the film by high temperature annealing.

For example, in a manufacturing method of a metal oxide film according to at least one embodiment of the present disclosure, before performing the anodization method, the metal oxide film is formed by magnetron sputtering.

For example, in a manufacturing method of a metal oxide film according to at least one embodiment of the present disclosure, at least two targets are provided for forming the metal oxide film in the magnetron sputtering, and the at least two targets are spaced apart from each other.

For example, in a manufacturing method of a metal oxide film according to at least one embodiment of the present disclosure, before performing the anodization method, the metal oxide film comprises at least two different regions, the at least two different regions comprises a first region and a second region, and during the magnetron sputtering, the first region overlaps the targets and the second region overlaps a gap between the targets, and a thickness of a portion of the metal oxide film located in the first region is greater than a thickness of a portion of the metal oxide film located in the second region.

At least one embodiment of the present disclosure provides a metal oxide film, the metal oxide film is manufactured by the manufacturing method of any one of the above embodiments of the present disclosure.

At least one embodiment of the present disclosure provides a thin film transistor, thin the film transistor comprises a semiconductor active layer, wherein the semiconductor active layer is formed by patterning the metal oxide film according to any one of the above embodiments of the present disclosure.

At least one embodiment of the present disclosure provides an array substrate, the array substrate comprises the thin film transistor according to any one of the above embodiments of the present disclosure.

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment, without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

There are two main methods commonly used for manufacturing a metal oxide film of a semiconductor active layer. A first method is a vacuum method in which a magnetron sputtering device is used to accelerate argon ions to fly toward a metal oxide target of a cathode under an electric field. The argon ions bombard a surface of the metal oxide target with high energy, which causes the target particles to be sputtered and deposited on a base substrate to form a corresponding metal oxide film. During this process, a portion of ionic bonds between the metal ions and the oxygen ions is broken, and the metal ion will lose oxygen ion, and oxygen vacancies (VO) are formed at the position where oxygen is lost after the film is formed. The oxygen vacancies are a source of metal oxide film carriers, so carrier concentrations in regions with different contents of oxygen vacancies are different.

Figure 1:
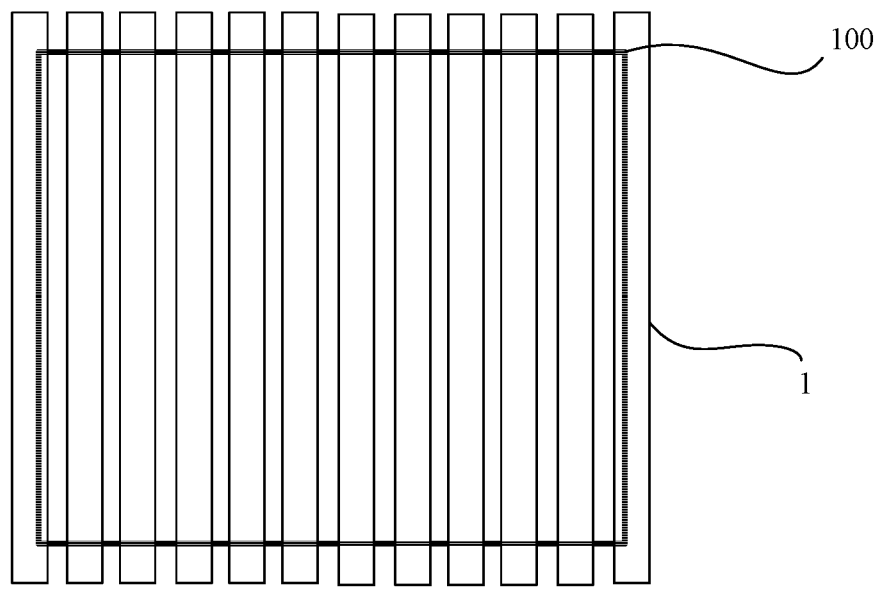
FIG. 1 is a schematic view showing a positional relationship between twelve metal oxide targets and a base substrate in a magnetron sputtering process according to some embodiments of the present disclosure.
Figure 2:
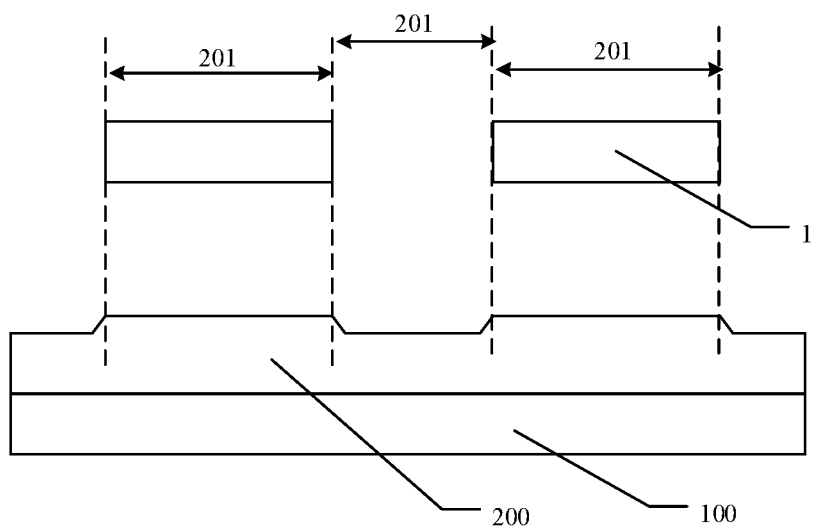
FIG. 2 is a cross-sectional view of a metal oxide film formed as shown in FIG. 1.

Taking a current 8.5th generation thin film transistor display production line as an example, a size of the base substrate reaches 2.2×2.5 meters. In order to meet the needs of production, a semiconductor active layer may be manufactured by forming a metal oxide using the magnetron sputtering. Since the metal oxide target for magnetron sputtering cannot be made to have such a large size, a plurality of metal oxide targets are usually used (for example, 12 metal oxide targets are used in the 8.5th generation thin film transistor display production line) to work simultaneously, so as to form a metal oxide film on a base substrate. At the time of forming a film by magnetron sputtering, a positional relationship between the 12 metal oxide targets 1 and the base substrate 100 is as shown in FIG. 1. In this way, the energy obtained by the particles sputtered from a position directly corresponding to the target 1 and the energy obtained by the particles sputtered from a position corresponding to a gap between the targets 1 are different, and a thickness of the film formed at the position corresponding to the gap between the targets and a thickness of the film formed at the position directly corresponding to the targets are also different (as shown in FIG. 2), which will cause carrier concentration of a metal oxide film formed on the base substrate at the position directly corresponding to the target being different from carrier concentration of a metal oxide film formed on the base substrate at the position corresponding to the gap between targets.

At present, an amount of electrons in the metal oxide film is usually tested by using u-PCD (microwave reflection photoconductivity attenuation method) to reflect a concentration distribution of carriers in the metal oxide film, from test results of u-PCD, it can be concluded that: the carrier concentration of the metal oxide film changes from high to low from a position directly corresponding to the targets to a position corresponding to the gap between the targets, that is, a concentration distribution of carriers in the metal oxide film is not uniform. Therefore, after patterning the metal oxide film to form a plurality of semiconductor active layers, the carrier concentrations in different semiconductor active layers are different, or carrier concentrations of different portions of one semiconductor active layer are different. In a case where the semiconductor active layer is formed by patterning the metal oxide film and the semiconductor active layer is applied to a thin film transistor to drive a display panel, a problem of uneven brightness occurs in a position corresponding to the gap between targets and the position directly corresponding to the targets.

For example, a metal oxide film forming a semiconductor active layer may also be manufactured by a solution method. For example, a precursor solution containing a metal oxide component is coated on a substrate by spin coating, inkjet printing or printing, and a precursor solution reacts by using a high temperature annealing to form a film of the corresponding component. During the high temperature annealing process, ionic bonds between the metal ions and the oxygen ions in a portion of the metal oxide film are broken, thus, oxygen ions may be lost, and oxygen vacancies (VO) may be formed at positions where oxygen ions are lost after the film is formed. The metal oxide film manufactured by the solution method often has a phenomenon of uneven thickness, and there is also a problem that the carrier concentrations of the metal oxide film are different in different regions.

At least one embodiment of the present disclosure provides a metal oxide film and a manufacturing method thereof, a thin film transistor and an array substrate, the manufacturing method comprises: forming a metal oxide film on a base substrate; and supplying oxygen negative ions to the metal oxide film for a predefined time period by using the anodization method, to convert a portion of metal ions in the metal oxide film into a metal oxide. For example, before the anodization method, the metal oxide film has a plurality of oxygen vacancies, and the numbers of oxygen vacancies per unit area of at least two different regions of the metal oxide film are unequal. The anodization method is used to supply negative ions to the metal oxide film for a predefined time period to reduce the number of oxygen vacancies. By supplying negative ions (for example, oxygen negative ions) to the metal oxide film, a portion of the metal ions in the metal oxide film is converted into a metal oxide, thereby reducing the carrier concentration difference between a region with a high carrier concentration and a region with a low carrier concentration, that is, after performing the anodization method, the carrier concentration distribution of the metal oxide film is uniform (for example, the oxygen vacancies are uniformly distributed), therefore, the problem of uneven brightness at different positions due to uneven distribution of carriers in the semiconductor active layer in the current display panel can be solved.

For example, in at least one embodiment of the present disclosure, during performing the anodization method, the negative ions provided may be oxygen negative ions or other types of negative ions. For example, the negative ions may be nitrogen negative ions.

Hereinafter, a metal oxide film and a manufacturing method thereof, a thin film transistor and an array substrate according to at least one embodiment of the present disclosure will be described by taking the negative ions provided during the anodization method being the oxygen negative ions as an example.

Figure 3:
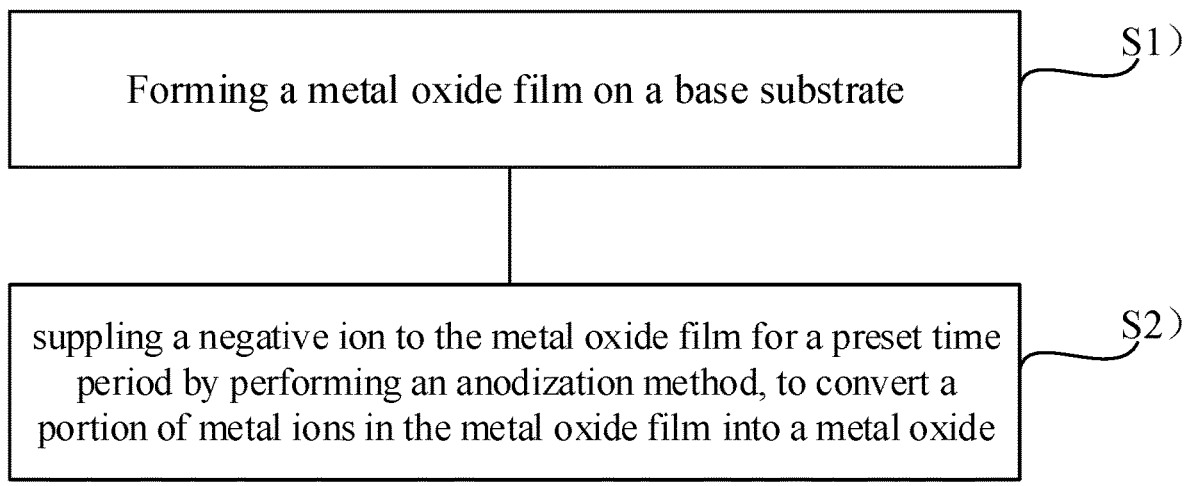
FIG. 3 is a schematic flow view of a method for manufacturing a metal oxide film according to some embodiments of the present disclosure.

Illustratively, referring to FIG. 3, a manufacturing method of a metal oxide film may include the following steps.

A step S1, forming a metal oxide film on a base substrate.

For example, in some embodiments of the present disclosure, the metal oxide film may be formed on the base substrate by magnetron sputtering method. For example, in other embodiments of the present disclosure, the metal oxide film may be formed on a base substrate by a solution method, for example, the metal oxide film may be formed on a base substrate by printing, spin coating, or inkjet printing.

For example, the metal oxide film is formed on a base substrate by a vacuum method, that is, magnetron sputtering method. The metal oxide film has a high film quality, a high film density, a low process temperature, and substantially no pollution to the environment. Therefore, the metal oxide film formed by magnetron sputtering method can be used to manufacture a large-sized display panel and reduce the cost of the manufacturing process.

A step S2, supplying oxygen negative ions to the metal oxide film for a predefined time period by using the anodization method, to convert a portion of metal ions in the metal oxide film into a metal oxide.

The metal oxide film has different concentration of carrier (oxygen vacancies) in different regions, that is, a surface resistance of the metal oxide film in different regions is also different. In a region where the carrier concentration is high, a surface resistance is small, an oxidation reaction occurs more intensely under a same electric field, that is, an oxygenation effect is relatively obvious, such that the oxygen vacancies can be quickly reduced and the carrier concentration can be lowered. In a region where the carrier concentration is low, the surface resistance is large, and the oxidation reaction occurs relatively slowly, that is, an oxygenation effect is relatively slow, and the carrier concentration is also slowly decreased. In this way, the anodization method can finally reduce a carrier concentration difference between the region where the carrier concentration is high and the region where the carrier concentration is low, that is, the carrier concentration distribution of the metal oxide film is uniform, such that a problem of uneven brightness at different positions due to uneven distribution of carriers in the semiconductor active layer in the present display panel can be solved.

The anodization method is an anodizing reaction performed under energization. The anodizing reaction conforms to Faraday's law. According to Faraday's law, a certain amount of electricity can convert a certain amount of metal ions into metal oxides, thereby reducing a content of the oxygen vacancies, that is, reducing the carrier concentration.

For example, in at least one embodiment of the present disclosure, a base substrate formed with a metal oxide film may be placed as an anode in an electrolytic cell, selecting an appropriate electrolytic solution and cathode material, generating an oxygen negative ions by electrolysis method, and moving the oxygen negative ions to the anode under an action of an electric field to react with a portion of the metal ions in the metal oxide film. Thereby, the oxygen vacancies in the metal oxide film are filled to reduce the carrier concentration in the metal oxide film.

In the electrolysis method using the electrolytic solution as mentioned above, anodization electrolyzes an electrolytic solution material such as water, that is, water at the cathode obtains electrons to release hydrogen (the reaction equation is as shown in the following formula (I)), anions (OH$^-$) with negative charges move toward the anode, and the electron e$^-$ is released at the anode (the reaction equation is as shown in the following formula (II)), and the oxidizing reaction occurs between a portion of the nascent (atomic) oxygens and a metal ion in the metal oxide film as an anode, to generate a metal oxide.

$$H^+ + e^- = \tfrac{1}{2}H_2 \tag{I}$$

$$4OH^- - 4e^- = 2H_2O + 2O_2 \tag{II}$$

In at least one embodiment of the present disclosure, the electrolytic solution material and the cathode material used in the electrolysis method are not specifically limited, as long as under the action of the electric field, the electrolytic solution is electrolyzed to generate oxygen negative ions, and the oxygen negative ions move toward the anode under the action of the electric field, to oxidize the metal ion in the metal oxide film as the anode.

For example, in a manufacturing method of a metal oxide film according to at least one embodiment of the present disclosure, the anodization method may be conducted in a neutral electrolytic solution having a pH of 6-7. The specific components of the neutral electrolytic solution may be selected as needed, and are not limited herein.

For example, in a manufacturing method of a metal oxide film according to at least one embodiment of the present disclosure, the electrolytic solution used in the electrolysis method is a mixed solution including ammonium tartrate, ethylene glycol, water, and the like. The mixed solution may be a neutral electrolytic solution.

For example, the ammonium tartrate can increase a conductivity of the solution and also buffer the pH value, the ethylene glycol can increase a voltage tolerance of the solution and also accelerate a heat dissipation of the electrolytic solution, further, an aqueous solution comprising the ammonium tartrate and the ethylene glycol has a weak ability to dissolve the metal oxide, and therefore, a relatively dense metal oxide film can be obtained.

For example, in at least one embodiment of the present disclosure, a mass percentage of the ammonium tartrate in the mixed solution of the ammonium tartrate, the ethylene glycol, and the water, is between 1% and 10%. For example, in at least one embodiment of the present disclosure, a mass percentage of the ethylene glycol in the mixed solution of the ammonium tartrate, the ethylene glycol, and the water, is between 50% and 80%. Therefore, during performing an anodization process, the mixed solution obtained under the above condition can improve a stability of an electrolytic condition, lower a roughness of the formed metal oxide film, such that the formed metal oxide film can have a higher density.

For example, in at least one embodiment of the present disclosure, during performing an anodization process, a cathode employed in the electrolysis method may be any electrically conductive material. Illustratively, the cathode used in the electrolysis method may be metallic iron, an alloy including metallic iron such as stainless steel, or the like.

For example, in at least one embodiment of the present disclosure, an energization mode employed in the electrolysis method is not limited as long as current can be supplied to the anode and the cathode.

For example, in a manufacturing method of a metal oxide film according to at least one embodiment of the present disclosure, the electrolysis method utilizes one of a constant current mode, a constant voltage mode, a first constant current and then constant voltage mode, and a first constant voltage and then constant current mode. For example, the constant current mode is to apply a constant current to the anode, the constant voltage mode is to apply a constant voltage on the anode. The first constant current and then constant voltage mode is to firstly apply a constant current to the anode for a certain period of time, and then apply a constant voltage to the anode for a certain period of time. The first constant voltage and then constant current mode is to firstly apply a constant voltage to the anode for a certain period of time, and then apply a constant current to the anode for a certain period of time.

Hereinafter, in some embodiments of the present disclosure, in a case where the electrolysis method is performed by using the constant voltage mode, the constant current mode, the first constant voltage and then constant current mode, and the first constant current and then constant voltage mode, the range and duration of voltage and current applied to the anode (metal oxide film) are described.

For example, in some embodiments of the present disclosure, in a case where the electrolysis method employs the constant voltage mode, the voltage applied to the anode is between 60 V and 100 V, and the preset time is 60 to 120 minutes. In this process, the voltage applied to the anode may be any value in the range of 60-100 V, such as 60 V, 70 V, 80 V, 90 V or 100 V, and the like. In an initial stage, the carrier concentration in the metal oxide film is high, in a case where the voltage is constant, as a portion of the metal ions in the metal oxide film are converted into the metal oxides, the carrier concentration becomes low, and accordingly, a resistance becomes large, therefore, as an anodizing reaction progresses, the current tends to change from high to low. However, for the voltage, it is not that larger is better. In a case where the carrier concentration is constant, as the voltage increases, the current density increases, such that a film formation speed is faster, and the obtained film is relatively rougher. By limiting the voltage applied to the anode to the above range, a anodization speed can be better controlled to obtain a denser film. For example, the preset time may be controlled to be 60-120 minutes, and the carrier concentration can be prevented from being too low to affect a semiconductor characteristic of the metal oxide film.

For example, in some other embodiments of the present disclosure, in a case where the electrolysis method employs the constant current mode, a current density applied to the anode may be between 1.5 mA/cm$^2$-3 mA/cm$^2$, and the preset time is 60-120 minutes. In this process, the current density applied to the anode may be any value in the range of 1.5 mA/cm$^2$-3 mA/cm$^2$, such as 1.5 mA/cm$^2$, 2 mA/cm$^2$, 2.5 mA/cm$^2$ or 3 mA/cm$^2$. In an initial stage, the carrier concentration in the metal oxide film is high, in a case where the current is constant, as a portion of the metal ions in the metal oxide film are converted into the metal oxides, the carrier concentration becomes low, and accordingly, a resistance becomes large, therefore, as an anodizing reaction progresses, the voltage tends to change from low to high. However, it is not that larger is better for the current density. In a case where the carrier concentration is constant, as the current density increases, the voltage increases, such that a film formation speed is faster, and the obtained film is rougher. By limiting the current density applied to the anode to the above range, the anodization speed can be better controlled to obtain a denser film. For example, the preset time may be controlled to be 60-120 minutes, and the carrier concentration can be prevented from being too low to affect a semiconductor characteristic of the metal oxide film.

For example, in some other embodiments of the present disclosure, in a case where the electrolysis method employs the first constant current and then constant voltage mode or the first constant voltage and then constant current mode, a voltage applied to the anode during a constant voltage process is between 60-100 V, and a current density applied to the anode during a constant current process is between 1.5 mA/cm$^2$-3 mA/cm$^2$, and at least one of the constant current process and the constant voltage process lasts for 40-80 minutes, for example, each of the constant current process and the constant voltage process lasts for 40-80 minutes. In the constant voltage process, the voltage applied to the anode may be any value in the range of 60-100 V, such as 60 V, 70 V, 80 V, 90 V or 100 V, and during the constant current process, the current density applied to the anode may be any value in the range of 1.5 mA/cm$^2$-3 mA/cm$^2$, such as 1.5 mA/cm$^2$, 2 mA/cm$^2$, 2.5 mA/cm$^2$ or 3 mA/cm$^2$. In a case of the first constant current mode and then constant voltage mode, in an initial stage, the carrier concentration in the metal oxide film is high. In a case where the current is constant, as a portion of the metal ions in the metal oxide film are converted into the metal oxides, the carrier concentration becomes low, and accordingly, the resistance becomes large, therefore, as an anodizing reaction progresses, the voltage tends to change from low to high. Then, in a case where the voltage is constant, as the carrier concentration becomes lower, a resistance becomes larger, therefore, as the anodizing reaction progresses, the current density tends to change from high to low. In this process, by limiting the voltage and the current density applied to the anode to the above ranges, the anodization speed can be better controlled to obtain a denser film; and on the contrary, in a case of the first constant voltage mode and then constant current mode, the same technical effects as those of the above technical solutions can be obtained by limiting the voltage and the current density applied to the anode to the above ranges, and details are not described herein again.

In at least one embodiment of the present disclosure, a solution method or magnetron sputtering may be selected to form a metal oxide film before performing the anodization method. Hereinafter, taking a case that the metal oxide film is formed by using the magnetron sputtering as an example, a structure of the metal oxide film formed before performing anodization method will be described.

For example, in at least one embodiment of the present disclosure, as shown in FIG. 1, there are at least two the targets for forming the metal oxide film in the magnetron sputtering and spaced apart from each other. For example, the number of the targets is 12 as shown in FIG. 1. After the magnetron sputtering is performed and a plurality of targets are arranged, gaps are formed between the targets, such that the thickness of the formed metal oxide film is uneven.

For example, in at least one embodiment of the present disclosure, before performing the anodization method, the numbers of oxygen vacancies per unit area of at least two different regions of the metal oxide film are unequal, that is, the carrier concentrations in the at least two regions are not equal. For example, as shown in FIG. 2, the at least two different regions include a first region 201 and a second region 202, and during magnetron sputtering, the first region 201 overlaps with the target 1, and the second region 202 overlaps with a gap between the targets 1, a thickness of a portion of the metal oxide film 200 located in the first region 201 is greater than a thickness of a portion of the metal oxide film 200 located in the second region 202. For example, the "thickness" is a dimension of the metal oxide film 200 in a direction perpendicular to a plane on which the base substrate 100 is located.

At least one embodiment of the present disclosure provides a thin film transistor, the the film transistor comprises a semiconductor active layer, the semiconductor active layer is formed by patterning the metal oxide film according to any one of the above embodiments of the present disclosure. For example, the thin film transistor may further include a gate electrode, a gate insulating layer, a semiconductor active layer, a source electrode and a drain electrode, and the like. For example, the thin film transistor may be of a bottom gate type, a top gate type, a double gate type, or other type.

For example, in at least one embodiment of the present disclosure, the semiconductor active layer may be obtained by a process of coating the metal oxide film with a photoresist, mask, exposure, etching, or the like.

It should be noted that, in the thin film transistor provided by at least one embodiment of the present disclosure, beneficial effects of the thin film transistor obtained by using the metal oxide film obtained by the manufacturing method in the foregoing embodiment may refer to the related description of the beneficial effects on the manufacturing method of the metal oxide film in the foregoing embodiment, and details are not described herein again.

At least one embodiment of the present disclosure provides an array substrate, the array substrate may include the thin film transistor described in any one of the above embodiments of the present disclosure.

It should be noted that, in an array substrate provided by at least one embodiment of the present disclosure, the beneficial effects of the array substrate obtained by using the thin film transistor in the foregoing embodiment may refer to the related description of the beneficial effects on the manufacturing method of the metal oxide film in the foregoing embodiment, and details are not described herein again.

At least one embodiment of the present disclosure provides a display panel, the display panel may include an array substrate as described in any one of the above embodiments of the present disclosure.

It should be noted that, in an array substrate provided by at least one embodiment of the present disclosure, the beneficial effects of the display panel obtained by using the array substrate in the foregoing embodiment may refer to the related description of the beneficial effects on the manufacturing method of the metal oxide film in the foregoing embodiment, and details are not described herein again.

One example of the display panel is a liquid crystal display panel, which may include an array substrate and an opposite substrate, the array substrate and the opposite substrate are opposed to each other to form a liquid crystal cell in which a liquid crystal material is filled. For example, the opposite substrate may be a color filter substrate. A pixel electrode of each of pixel units of the array substrate is used to apply an electric field to control a degree of rotation of the liquid crystal material to perform a display operation.

Another example of the display panel is an organic light emitting diode (OLED) display panel in which a stack of organic light emitting materials is formed on the array substrate, and a pixel electrode of each of pixel units is used as an anode or a cathode for driving the organic light emitting material to emit light to perform a display operation.

Still another example of the display panel is an electronic paper display device in which an electronic ink layer is formed on an array substrate, and a pixel electrode of each of pixel units is used to provide a voltage for driving charged microparticles to move in an electronic ink to perform a display operation.

Hereinafter, in some specific examples, a method of manufacturing a metal oxide film will be described.

For example, in one specific example of at least one embodiment of the present disclosure, firstly, a metal oxide film (for example, IGZO, ITZO, or the like) may be deposited on a glass substrate by a magnetron sputtering apparatus. For example, a 2.2×2.5 m glass substrate is taken as an example, and 12 metal oxide targets and the glass substrate are placed opposite each other in a manner shown in FIG. 1, and the metal oxide target is deposited on the glass substrate by magnetron sputtering, then a portion of the metal ions in the metal oxide film is oxidized by using the anodization method.

For example, an electrolytic solution required for anodization method may be manufactured first, and the electrolytic solution is a mixed solution of ammonium tartrate: ethylene glycol:water=5 wt. %:65 wt. %:30 wt. %. A glass substrate on which a metal oxide film is deposited is placed at an anode in an electrolytic cell, and then a constant voltage (voltage range of 60-100 V) is applied to the anode to oxidize a portion of the metal ions in the metal oxide film. A mode in which a constant voltage is applied is called a constant voltage mode. The metal oxide film is oxidized in a constant voltage mode for 60 to 120 minutes. After the oxidation is completed, the glass substrate is taken out and washed with deionized water, to remove the electrolytic solution remained on the surface of the glass substrate.

For example, in one specific example of at least one embodiment of the present disclosure, firstly, a layer of metal oxide film (for example, IGZO, ITZO, or the like) may be deposited on a glass substrate by using a magnetron sputtering apparatus, the specific process may refer to the related description in the above example, and details are not described herein again. Then a portion of the metal ions in the metal oxide film is oxidized by using the anodization method.

For example, an electrolytic solution required for the anodization method may be manufactured first, and the electrolytic solution is a mixed solution of ammonium tartrate:ethylene glycol:water=2 wt. %:68 wt. %:30 wt. %. A glass substrate on which a metal oxide film is deposited is placed at an anode in an electrolytic cell, and then a constant current (current density range of 1.5 mA/cm$^2$-3 mA/cm$^2$) is applied to the anode to oxidize the metal oxide film. A mode in which a constant current is applied is called a constant current mode. The metal oxide film is oxidized in a constant current mode for 60 to 120 minutes. After the oxidation is completed, the glass substrate is taken out and washed with deionized water, to remove the electrolytic solution remained on the surface of the glass substrate.

For example, in one specific example of at least one embodiment of the present disclosure, firstly, a layer of metal oxide film (for example, IGZO, ITZO, or the like) may be deposited on a glass substrate by using a magnetron sputtering apparatus, the specific process may refer to the related description in the above example, and details are not described herein again. Then the metal oxide film is oxidized by using the anodization method. First, an electrolytic solution required for anodization method may be manufactured first, and the electrolytic solution is a mixed solution of ammonium tartrate:ethylene glycol:water=10 wt. %:50 wt. %:40 wt. % of the mixed solution. A glass substrate on which a metal oxide film is deposited is placed at an anode in an electrolytic cell, and then a constant voltage (voltage range of 60-100 V) is applied to the anode to oxidize a portion of the metal ions in the metal oxide film. The metal oxide film is oxidized in a constant voltage mode for 40 to 80 minutes. After a process of the constant voltage mode is finished, a constant current (current density range of 1.5 mA/cm$^2$-3 mA/cm$^2$) is applied to the anode to oxidize a portion of the metal ions in the metal oxide film, and the metal oxide film is oxidized in a constant current mode for 40 to 80 minutes. This mode of applying a constant voltage first and then applying a constant current is called a first constant voltage and then constant current mode. After the oxidation is completed, the glass substrate is taken out and washed with deionized water, to remove the electrolytic solution remained on the surface of the glass substrate.

For example, in one specific example of at least one embodiment of the present disclosure, firstly, a layer of metal oxide film (for example, IGZO, ITZO, or the like) is deposited on a glass substrate by using a magnetron sputtering apparatus, the specific process may refer to the related description in the above example, and details are not described herein again.

Then, by using the anodization method, the metal oxide film is oxidized. Firstly, an electrolytic solution required for the anodization method may be manufactured, and the electrolytic solution is a mixed solution of ammonium tartrate:ethylene glycol:water=1 wt. %:80 wt. %:19 wt. % of the mixed solution. A glass substrate on which the metal oxide film is deposited is placed at an anode in an electrolytic cell, and then a constant current (current density range of 1.5 mA/cm$^2$-3 mA/cm$^2$) is applied to the anode to oxidize a portion of the metal ions in the metal oxide film. The metal oxide film is oxidized in a constant current mode for 40 to 80 minutes. After a process of the constant current mode is finished, a constant voltage (voltage range of 60-100 V) is applied to the anode to oxidize a portion of the metal ions in the metal oxide film, and the metal oxide film is oxidized in a constant voltage mode for 40 to 80 minutes. This mode of applying a constant current first and then applying a constant voltage is called a first constant current and then constant voltage mode. After the oxidation is completed, the glass substrate is taken out and washed with deionized water, to remove the electrolytic solution remained on the surface of the glass substrate.

For example, in another specific example of at least one embodiment of the present disclosure, a layer of metal oxide film (for example, IGZO, ITZO, or the like) is first deposited on a 1.8 m×1.5 m glass substrate by inkjet printing. The obtained metal oxide film has a problem of uneven thickness. Then the metal oxide film is oxidized by an anodization method.

For example, an electrolytic solution required for the anodization method may be manufactured first, and the electrolytic solution is a mixed solution of ammonium tartrate:ethylene glycol:water=6 wt. %:70 wt. %:24 wt. %. A glass substrate on which a metal oxide film is deposited is placed at an anode in an electrolytic cell, and then a constant current (current density range of 1.5 mA/cm$^2$-3 mA/cm$^2$) is applied to the anode to oxidize a portion of the metal ions in the metal oxide film. A mode in which a constant current is applied is called a constant current mode. The metal oxide film is oxidized in a constant current mode for 60 to 120 minutes. After the oxidation is completed, the glass substrate is taken out and washed with deionized water, to remove the electrolytic solution remained on the surface of the glass substrate.

In summary, after forming a metal oxide film on a base substrate, in order to solve a problem that a obtained metal oxide film generally has a problem of different carrier concentration in different regions due to uneven thickness, an anodization method is used to provide oxygen negative ions to the metal oxide film, to convert a portion of metal ions in the metal oxide film into metal oxide. Specifically, since the metal oxide film has different carrier concentrations in different regions, therefore, under a same electric field, in a region where the carrier concentration is high, a surface resistance is small, an oxidation reaction occurs more intensely, that is, an oxygenation effect is relatively obvious, such that the oxygen vacancies can be quickly reduced and the carrier concentration can be lowered. In the region where the carrier concentration is low, the surface resistance is large, and the oxidation reaction occurs relatively slowly, that is, an oxygenation effect is relatively slow, and the carrier concentration is also slowly decreased. In this way, the anodization method can finally balance the carrier concentration of the region where the carrier concentration is high and the region where the carrier concentration is low, thereby a problem of uneven brightness at different positions of the display panel can be solved.

For the present disclosure, the following points should be noted:

(1) The accompanying drawings in the embodiments of the present disclosure only involve structures relevant to the embodiments of the present disclosure, and other structures may refer to the conventional design.

(2) For clarity, in the accompanying drawings of the embodiments of the present disclosure, the thickness of layers or regions is enlarged or reduced. That is, the accompanying drawings are not drawn according to actual scales.

(3) The embodiments of the present disclosure and the characteristics in the embodiments may be mutually combined without conflict.

The described above are only specific embodiments of the present disclosure, and the present disclosure is not limited thereto. The scope of the present disclosure is defined by the accompanying claims.

What is claimed is:

1. A manufacturing method of a metal oxide film, comprising:
    forming the metal oxide film on a base substrate; and
    supplying a negative ion to the metal oxide film for a preset time period by performing an anodization method, to convert a portion of metal ions in the metal oxide film into a metal oxide,
    wherein before performing the anodization method, the metal oxide film includes a plurality of oxygen vacancies, and
    numbers of the plurality of oxygen vacancies per unit area of at least two different regions in the metal oxide film are unequal.

2. The manufacturing method of the metal oxide film according to claim 1, wherein the oxygen vacancies in the metal oxide film are uniformly distributed after performing the anodization method.

3. The manufacturing method of the metal oxide film according to claim 1, wherein the performing the anodization method comprises:
    placing the metal oxide film in an electrolytic cell to serve as an anode, and supplying oxygen negative ions to the metal oxide film by an electrolysis method.

4. The manufacturing method of the metal oxide film according to claim 3, wherein an electrolytic solution used in the electrolysis method is a mixed solution comprising ammonium tartrate, ethylene glycol, and water.

5. The manufacturing method of the metal oxide film according to claim 4, wherein a mass percentage of the ammonium tartrate in the mixed solution is between 1% and 10%.

6. The manufacturing method of the metal oxide film according to claim 4, wherein a mass percentage of the ethylene glycol in the mixed solution is between 50% and 80%.

7. The manufacturing method of the metal oxide film according to claim 4, wherein a pH of the electrolytic solution is 6-7.

8. The manufacturing method of the metal oxide film according to claim 3, wherein
    the electrolysis method comprises one of a constant current mode, a constant voltage mode, a first constant current and then constant voltage mode, and a first constant voltage and then constant current mode; and
    the constant current mode is to apply a constant current to the anode, the constant voltage mode is to apply a constant voltage to the anode.

9. The manufacturing method of the metal oxide film according to claim 8, wherein
    in a case where the electrolysis method employs the constant voltage mode, a voltage applied to the anode is between 60 V-100 V; or
    in a case where the electrolysis method employs the constant current mode, a current density applied to the anode is between 1.5 mA/cm$^2$-3 mA/cm$^2$; or
    in a case where the electrolysis method employs the first constant current and then constant voltage mode or the first constant voltage and then constant current mode, a voltage applied to the anode during a constant voltage process is between 60 V-100 V, and a current density applied to the anode during a constant current process is between 1.5 mA/cm$^2$-3 mA/cm$^2$.

10. The manufacturing method of the metal oxide film according to claim 8, wherein in a case where the electrolysis method employs the constant current mode or the constant voltage mode, the preset time period is 60-120 minutes.

11. The manufacturing method of the metal oxide film according to claim 8, wherein in a case where the electrolysis method adopts the first constant current and then constant voltage mode or the first constant voltage and then constant current mode, at least one of a constant current process and a constant voltage process lasts for 40-80 minutes.

12. The manufacturing method of the metal oxide film according to claim 1, wherein before performing the anodization method, the metal oxide film is formed by a solution method.

13. The manufacturing method of the metal oxide film according to claim 12, wherein the solution method comprises:
    forming a film by a precursor solution containing a metal oxide component using spin coating, inkjet printing or printing coating; and
    treating the film by high temperature annealing.

14. The manufacturing method of the metal oxide film according to claim 1, wherein before performing the anodization method, the metal oxide film is formed by magnetron sputtering.

15. The manufacturing method of the metal oxide film according to claim 14, wherein at least two targets are provided for forming the metal oxide film in the magnetron sputtering, and the at least two targets are spaced apart from each other.

16. The manufacturing method of the metal oxide film according to claim 15, wherein
    before performing the anodization method, the metal oxide film comprises at least two different regions, the at least two different regions comprises a first region and a second region, and during the magnetron sputtering, the first region overlaps the targets and the second region overlaps a gap between the targets, and
    a thickness of a portion of the metal oxide film located in the first region is greater than a thickness of a portion of the metal oxide film located in the second region.

17. A metal oxide film, manufactured by the manufacturing method of claim 1.

18. A thin film transistor, comprising a semiconductor active layer, wherein the semiconductor active layer is formed by patterning the metal oxide film according to claim 17.

19. An array substrate, comprising the thin film transistor according to claim 18.

\* \* \* \* \*